(12) United States Patent
Kim et al.

(10) Patent No.: US 10,535,819 B2
(45) Date of Patent: Jan. 14, 2020

(54) ELECTRONIC DEVICE AND METHOD FOR FABRICATING THE SAME

(71) Applicant: SK hynix Inc., Icheon (KR)

(72) Inventors: Hyo June Kim, Seoul (KR); Chi Ho Kim, Yongin (KR); Sang Hoon Cho, Gwacheon (KR); Eung Rim Hwang, Seoul (KR)

(73) Assignee: SK HYNIX INC., Icheon (KR)

( * ) Notice: Subject to any disclaimer, the term of this patent is extended or adjusted under 35 U.S.C. 154(b) by 11 days.

(21) Appl. No.: 15/942,294

(22) Filed: Mar. 30, 2018

(65) Prior Publication Data

US 2019/0088871 A1   Mar. 21, 2019

(30) Foreign Application Priority Data

Sep. 15, 2017 (KR) .......................... 10-2017-0118687

(51) Int. Cl.
  *H01L 45/00* (2006.01)
  *H01L 27/24* (2006.01)
  *H01L 27/22* (2006.01)

(52) U.S. Cl.
  CPC ...... *H01L 45/1233* (2013.01); *H01L 27/2481* (2013.01); *H01L 45/1608* (2013.01); *H01L 45/06* (2013.01)

(58) Field of Classification Search
  None
  See application file for complete search history.

(56) References Cited

U.S. PATENT DOCUMENTS

| 9,054,295 | B2 | 6/2015 | Gotti et al. | |
| 2009/0045483 | A1* | 2/2009 | Rha | H01L 21/76232 257/513 |
| 2013/0048935 | A1* | 2/2013 | Gotti | H01L 45/06 257/2 |
| 2017/0084696 | A1* | 3/2017 | Lee | H01L 27/11565 |

FOREIGN PATENT DOCUMENTS

| KR | 10-2010-0089023 A | 8/2010 |
| KR | 10-1069655 B1 | 10/2011 |

* cited by examiner

*Primary Examiner* — Moazzam Hossain
*Assistant Examiner* — Stanetta D Isaac

(57) ABSTRACT

In a method for fabricating an electronic device including a semiconductor memory, the method includes: forming stack structures, each of the stack structures including a variable resistance pattern; forming capping layers on the stack structures, the capping layers including an impurity; forming a gap fill layer between the stack structures; and removing the impurity from the capping layers and densifying the gap fill layer by irradiating the capping layers and the gap fill layer with ultraviolet light.

20 Claims, 9 Drawing Sheets

ELECTRONIC DEVICE AND METHOD FOR FABRICATING THE SAME

CROSS-REFERENCE TO RELATED APPLICATION

The present application claims priority under 35 U.S.C. § 119(a) to Korean patent application number 10-2017-0118687, which was filed on Sep. 15, 2017, the entire disclosure of which is incorporated herein by reference.

BACKGROUND

1. Field

An aspect of the present disclosure relates to a memory circuit or a memory device, and an application thereof in an electronic device.

2. Description of the Related Art

Recently, as electronic devices trend toward miniaturization, low power consumption, high performance, multi-functionality, and so on, semiconductor devices capable of storing information in various electronic appliances, such as computers and portable communication devices, have been demanded in the art. Thus, research has been conducted for the development of a type of semiconductor device capable of storing data corresponding to different resistance states of the device, and capable of switching between the different resistance states according to an applied voltage or current. Examples of the type of semiconductor device include a resistive random access memory (RRAM), a phase change random access memory (PRAM), a ferroelectric random access memory (FRAM), a magnetic random access memory (MRAM), an E-fuse, and the like.

SUMMARY

Embodiments provide an electronic device having memory cells with improved operational characteristics and reliability and a method for fabricating the electronic device.

According to an aspect of the present disclosure, there is provided a method for fabricating an electronic device including a semiconductor memory, the method including: forming stack structures, each of the stack structures including a variable resistance pattern; forming capping layers on the stack structures, the capping layers including an impurity; forming a gap fill layer between the stack structures; and removing the impurity from the capping layers and densifying the gap fill layer by irradiating the capping layers and the gap fill layer with ultraviolet light.

According to an aspect of the present disclosure, there is provided a method for fabricating an electronic device including a semiconductor memory, the method including: forming stack structures, each of the stack structures including a variable resistance pattern; forming capping layers on the stack structures, the capping layers including an impurity; forming a gap fill layer between the stack structures; and removing the impurity from the capping layers and densifying the gap fill layer by plasma-treating the capping layers and the gap fill layer.

According to an aspect of the present disclosure, there is provided an electronic device including a semiconductor memory, wherein the semiconductor memory includes: stack structures; first capping layers covering first portions of sidewalls of the stack structures; second capping layers covering the first capping layers and second portions of the sidewalls of the stack structures, the second portions being exposed by the first capping layers; and a gap fill layer filling one or more gaps between the stack structures, wherein a concentration of a hydrogen-based impurity in the first capping layers is lower than a concentration of the hydrogen-based impurity in the second capping layers.

DETAILED DESCRIPTION

Figure 1A:
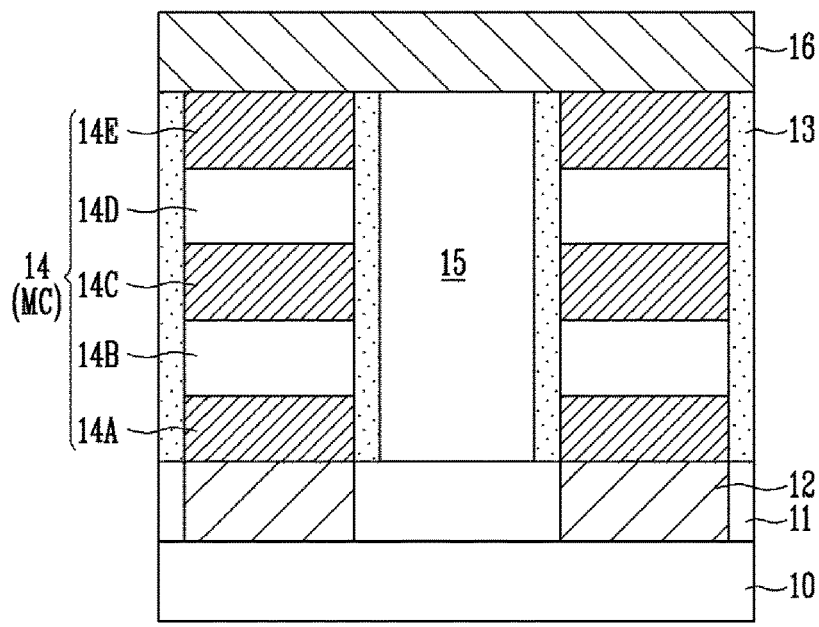
FIGS. 1A and 1B are cross-sectional views illustrating structures of electronic devices according to embodiments of the present disclosure.

Hereinafter, various embodiments will be described in detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

The drawings are not necessarily to scale and, in some instances, proportions may have been exaggerated in order to clearly illustrate features of the embodiments. It will be understood that when an element is referred to as being "between" two elements, it can be the only element between the two elements, or one or more intervening elements may also be present. When a first layer is referred to as being "on" a second layer or "on" a substrate, it not only refers to a case where the first layer is formed directly on the second layer or the substrate but also a case where a third layer exists between the first layer and the second layer or the substrate. Like reference numerals refer to like elements throughout the disclosure.

Figure 1B:
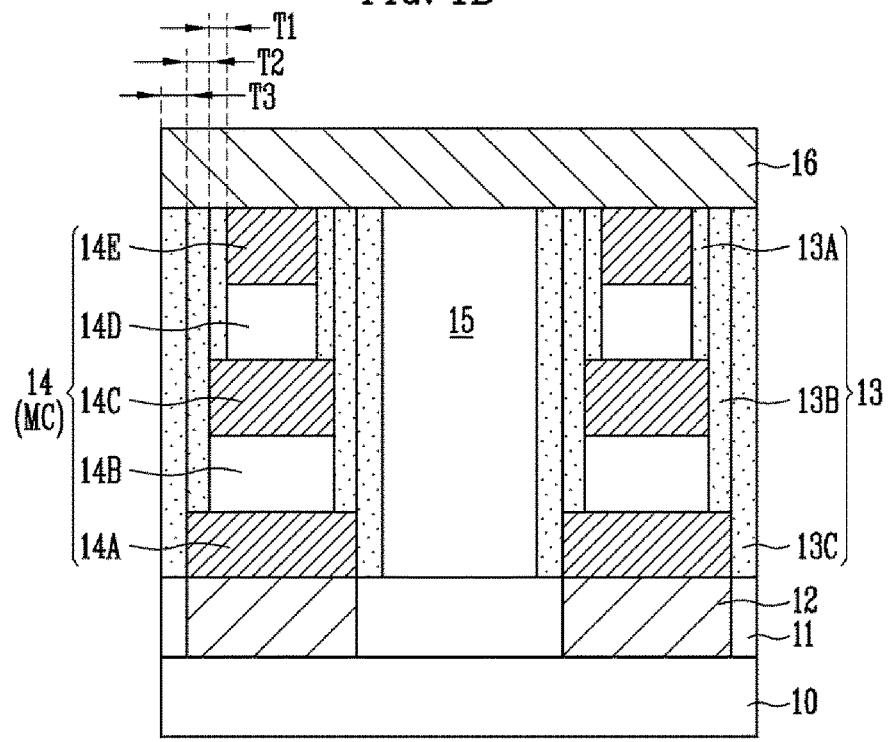

FIGS. 1A and 1B are cross-sectional views illustrating structures of electronic devices according to embodiments of the present disclosure.

Referring to the embodiments of FIGS. 1A and 1B, an electronic device according to an embodiment of the present disclosure may include a semiconductor memory. The semiconductor memory may include capping layers 13 and stack structures 14, which include variable resistance patterns 14D. The electronic device may further include a substrate 10, an insulating layer 11, first signal lines 12, second signal lines 16, a gap fill layer 15, and the like.

The stack structures 14 may be arranged in respective intersection regions of the first signal lines 12 and the second signal lines 16. The stack structures 14 may be electrically coupled between the first signal lines 12 and the second signal lines 16.

The first signal lines 12 are located on the substrate 10, and may extend in parallel in a first direction. The insulating layer 11 may fill a gap region between adjacent first signal lines 12.

In addition, the second signal lines 16 are located on the stack structures 14, and may extend in a second direction that crosses the first direction. The first and second signal lines 12 and 16 may be word lines and bit lines, respectively, or vice versa.

Each of the stack structures 14 may be a memory cell MC. For example, each of the stack structures 14 includes a lower electrode 14A, a switching material pattern 14B, an intermediate electrode 14C, a variable resistance pattern 14D, and an upper electrode 14E.

The variable resistance pattern 14D reversibly switches between different resistance states according to a voltage or current applied to the variable resistance pattern 14D. Therefore, if the variable resistance pattern 14D has a low resistance state, the memory cell MC may be storing data '1.' If the variable resistance pattern 14D has a high resistance state, the memory cell MC may be storing data '0.'.

Here, the variable resistance pattern 14D may be a phase-change layer, a resistance-change layer, a magnetic tunnel junction layer, or a combination thereof. As an example, the variable resistance pattern 14D is a phase-change layer and may include a chalcogenide-based material. The chalcogenide-based material may be Ge—Sb—Te (GST), and may include one or more of $Ge_2Sb_2Te_5$, $Ge_2Sb_2Te_7$, $Ge_1Sb_2Te_4$, $Ge_1Sb_4Te_7$, and the like. As another example, the variable resistance pattern 14D is a resistance-change layer and may include a transition metal oxide; a metal oxide, such as a perovskite-based material; or a combination thereof. As still another example, the variable resistance pattern 14D is a magnetic tunnel junction layer, and may be a single magnetic tunnel junction layer, a double magnetic tunnel junction layer, or the like. In addition, the variable resistance pattern 14D may have a single- or multi-layered structure.

The switching material pattern 14B may be a selection element that controls a flow of current through the switching material pattern 14B according to a magnitude of a voltage or current applied to the switching material pattern 14B. Therefore, the switching material pattern 14B may block the flow of current when the magnitude of the applied voltage or current is a predetermined critical value or less, and may allow the flow of current when the magnitude of the applied voltage or current exceeds the predetermined critical value. That is, the switching material pattern 14B may have a larger electrical resistance when the applied voltage or current is the predetermined critical value or less, and a smaller electrical resistance when the applied voltage or current is greater than the predetermined critical value.

As an example, the switching material pattern 14B may be an ovonic threshold switching (OTS) element, and may include a chalcogenide-based material, such as $As_2Te_3$, Ase, $As_2Se_3$, or a combination thereof. As another example, the switching material pattern 14B may be a metal insulator transition (MIT) element, and may include any of $NbO_2$, $TiO_2$, and the like. As still another example, the switching material pattern 14B may be a mixed ion-electron conducting (MIEC) element, and may include any of $ZrO_2(Y_2O_3)$, $Bi_2O_3$—BaO, $(La_2O_3)_x(CeO_2)_{1-x}$, and the like. Also, the switching material pattern 14B may have a single- or multi-layered structure.

The lower electrode 14A is electrically connected to the first signal line 12, and may serve as a path through which a current or voltage supplied from the first signal line 12 is transferred. The intermediate electrode 14C may be interposed between the switching material pattern 14B and the variable resistance pattern 14D. In addition, the upper electrode 14E is electrically connected to the second signal line 16, and may serve as a path through which a current or voltage supplied from the second signal line 16 is transferred. The lower electrode 14A, the intermediate electrode 14C, and the upper electrode 14E may each have a single- or multi-layered structure, and may each include one or more of a metal, a metal nitride, carbon, and the like.

In addition, upper and lower portions of each of the stack structures 14 may have widths that are equal to or different from each other. Referring to an embodiment illustrated by FIG. 1A, the upper and lower portions of each of the stack structures 14 have widths that are equal to each other. For example, the lower electrode 14A, the switching material pattern 14B, the intermediate electrode 14C, the variable resistance pattern 14D, and the upper electrode 14E have a uniform width. Referring to an embodiment illustrated by FIG. 1B, each of the stack structures 14 widens in a direction from its upper portion to its lower portion. For example, the lower electrode 14A is wider than the intermediate electrode 14C and the switching material pattern 14B, and the intermediate electrode 14C and the switching material pattern 14B are wider than the upper electrode 14E and the variable resistance pattern 14D. In an embodiment, a sidewall of the stack structure 14 may have a step shape.

For reference, the form and configuration of the stack structure 14 may be variously modified. For example, at least one of the lower electrode 14A, the intermediate electrode 14C, and the upper electrode 14E may be omitted. Alternatively, one or more layers (not shown) for improving characteristics or processes of the memory cell MC may be additionally provided at an interface or interfaces between the layers 14A to 14E included in the stack structure 14.

The capping layers 13 are provided to protect the stack structures 14, and to prevent the variable resistance pattern 14D, the switching material pattern 14B, etc. from being exposed or damaged in a fabricating process. Therefore, the capping layers 13 may be formed on the stack structures 14, respectively. For example, the capping layers 13 may be formed on sidewalls of the stack structures 14, respectively. The capping layers 13 may each include a nitride layer, and may include any of silicon oxide, silicon nitride, and the like.

Each of the capping layers 13 may have a single- or multi-layered structure. Referring to the embodiment illustrated by FIG. 1A, each of the capping layers 13 has a single-layered structure, and has a spacer shape that is disposed on sidewalls of a corresponding one of the stack structures 14 and surrounds the corresponding one of the stack structures 14. Referring to the embodiment illustrated by FIG. 1B, each of the capping layers 13 has a multi-layered structure. For example, each of the capping layers 13 may include first to third capping layers 13A to 13C, which are stacked on sidewalls of the corresponding stack structure 14.

The capping layers 13 of the semiconductor memory may have the same thicknesses, different thicknesses, or a combination thereof. Each capping layer 13 may have different regions with equal or different thicknesses. Referring to the embodiment illustrated by FIG. 1A, the capping layers 13 may each be a single layer that may be disposed along sidewalls of a corresponding one of the stack structures 14, and may have a uniform thickness. Alternatively, the capping layers 13 may each have a varying thickness, e.g., a thickness that decreases along a downward direction with respect to the orientation of FIG. 1A or 1B, and may be formed by controlling deposition conditions of the capping layers 13. Referring to the embodiment illustrated by FIG. 1B, the capping layers 13 may each include multiple layers, may be disposed along sidewalls of a corresponding one of the stack structures 14, and may each have a thickness that decreases along the downward direction. That is, each of the capping layers 13 may have a lower portion and an upper portion, and the lower portion may be thinner than the upper portion. For example, when each of the capping layers 13 includes the first to third capping layers 13A to 13C as illustrated in FIG. 1B, an upper portion of the stack structure 14 may be surrounded by the first to third capping layers 13A to 13C, an intermediate portion of the stack structure 14 may be surrounded by the first and second capping layers 13A and 13B, and a lower portion of the stack structure 14 may be surrounded by the third capping layer 13C.

When each of the capping layers 13 has a multi-layered structure, multiple layers included in one capping layer 13 may have thicknesses that are equal to or different from one another. Referring to the embodiment illustrated by FIG. 1B, the first to third capping layers 13A to 13C may have thicknesses that are equal to or different from one another. For example, the second capping layer 13B may have a thickness T2 that is greater than a thickness T1 of the first capping layer 13A (T1<T2), and the third capping layer 13C may have a thickness T3 that is greater than the thickness T2 of the second capping layer 13B (T2<T3).

The capping layers 13 may be treated using ultraviolet light, plasma, or both. Therefore, the capping layers 13 may not include an impurity, or may have a relatively low concentration of the impurity. Here, the impurity may be a hydrogen-based compound. For example, the impurity may be $H_2$, $CH_3$, $NH_3$, $H_2O$, $HF$, $CO$, $HCL$, $CO_2$, or any combination thereof. Therefore, each of the capping layers 13 may be a dehydrogenated nitride layer.

Each of the capping layers 13 may have a gradient structure, in which the concentration of the impurity changes along a thickness direction of the capping layer 13, a stacking direction of the stack structure 14, or a combination thereof. For example, each of the capping layers 13 may have a concentration of the impurity that increases or decreases along a direction toward the stack structure 14. In an embodiment, each of the capping layers 13 may have a concentration of the impurity that increases or decreases along a downward direction with respect to the orientation of FIG. 1A or 1B.

When each of the capping layers 13 has a multi-layered structure, each of the capping layers 13 may include interfaces treated using ultraviolet light, plasma, or both. Referring to the embodiment illustrated by FIG. 1B, an interface between the first capping layer 13A and the second capping layer 13B, and an interface between the second capping layer 13B and the third capping layer 13C, may each be treated using ultraviolet light, plasma, or both. In an embodiment, only some interfaces among the interfaces included in one capping layer 13 may be treated using ultraviolet light, plasma, or both.

The gap fill layer 15 is provided to fill a gap between the stack structures 14, and may be an oxide layer. The gap fill layer 15 may be treated together with the capping layer 13, using the ultraviolet light, plasma, or both. Accordingly, the gap fill layer 15 can be densified and cured. Therefore, the gap fill layer 15 may include a smaller number of voids than a layer that has not been treated using ultraviolet light, plasma, or both, or may not include any voids. Also, the gap fill layer 15 may have a gradient structure. For example, a density of the gap fill layer 15 may vary along the stacking direction of the stack structure 14.

Figure 2A:
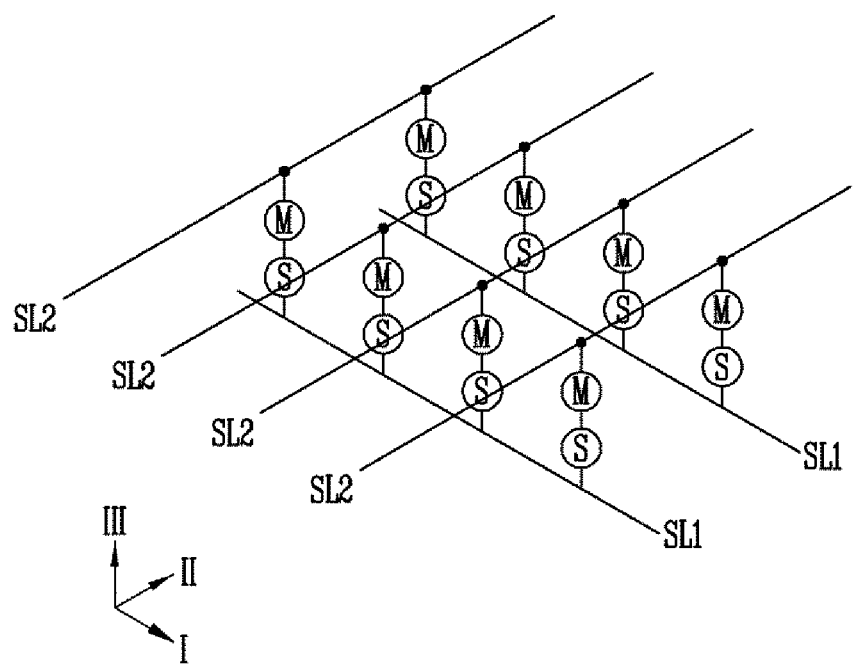
FIGS. 2A to 2C are views illustrating an array structure of an electronic device according to embodiments of the present disclosure.
Figure 2B:
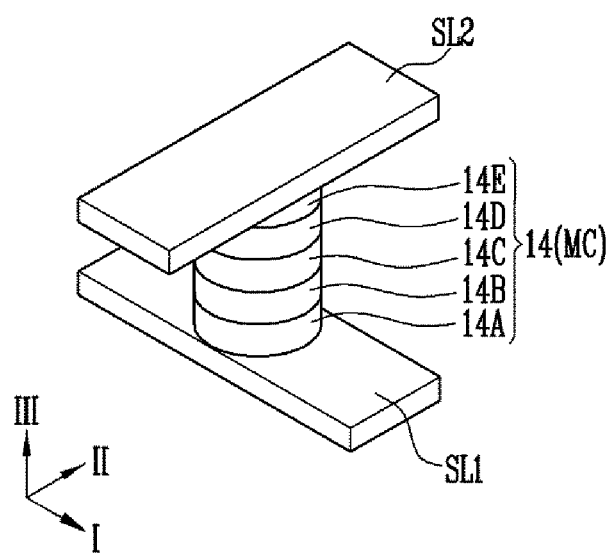
Figure 2C:
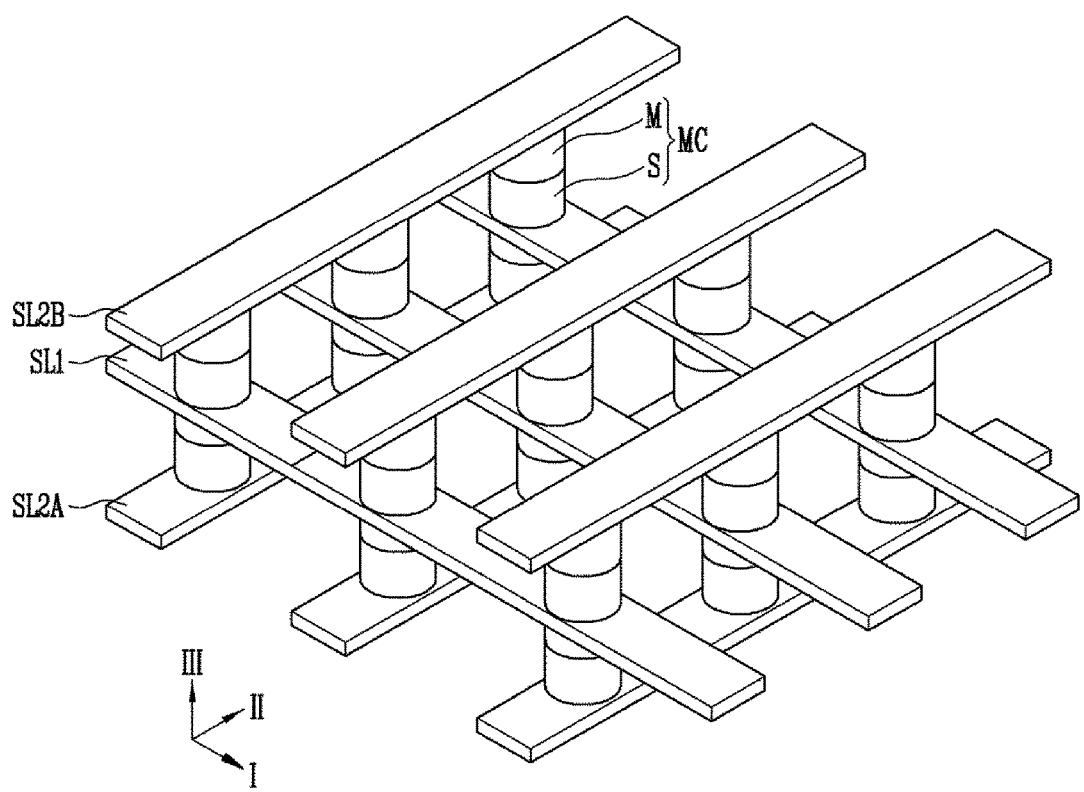

FIGS. 2A to 2C are views illustrating an array structure of an electronic device according to embodiments of the present disclosure. FIG. 2A is an equivalent circuit diagram of a memory cell array, FIG. 2B is a perspective view illustrating a unit memory cell, and FIG. 2C is a perspective view illustrating a memory cell array.

Referring to an embodiment illustrated by FIG. 2A, the electronic device may include a semiconductor memory, and the semiconductor memory may include first signal lines SL1 and second signal lines SL2. The second signal lines SL2 may be located at a different level from the first signal lines SL1.

Here, the first signal lines SL1 may extend in parallel in a first direction I, and the second signal lines SL2 may extend in parallel in a second direction II that intersects the first direction I. For example, the first signal lines SL1 may be word lines and the second signal lines SL2 may be bit lines. Alternatively, the first signal lines SL1 may be bit lines and the second signal lines SL2 may be word lines.

Memory cells MC may be arranged between the first signal lines SL1 and the second signal lines SL2. Specifically, the memory cells MC may be arranged at intersection regions of the first signal lines SL1 and the second signal lines SL2. Each of the memory cells MC may include a selection element S and a memory element M. The selection element S may be electrically connected to one of the first signal lines SL1, and the memory element M may be electrically connected to one of the second signal lines SL2.

Each memory element M stores data, and may include a variable resistance pattern. Each memory element M may be any of a phase-change layer, a resistance-change layer, a magnetic tunnel junction layer, and the like. Each selection element S selects the corresponding memory cell MC, and may include a switching material pattern. Each selection element S may be any of an OTS element, an MIT element, an MIEC element, and the like.

For reference, the form and configuration of the memory cells MC may be variously modified. For example, the selection element S of each of the memory cells MC may be omitted, or the positions of the selection element S and the memory device M in each of the memory cells MC may be reversed. That is, the selection element S may be electrically connected to one of the second signal lines SL2, and the memory element M may be electrically connected to one of the first signal lines SL1.

According to such a structure, a desired memory cell MC can be selected by selectively activating one of the first signal lines SL1 corresponding to the desired memory cell MC and one of the second signal lines SL2 corresponding to the desired memory cell MC. Data can be stored in the selected memory cell MC by applying a predetermined signal to the corresponding first signal line SL1 and the corresponding second signal line SL2. In addition, the data stored in the selected memory cell MC can be read by measuring a current flowing through the first signal line SL1 or the second signal line SL2.

Referring to an embodiment illustrated by FIG. 2B, each of the memory cells MC includes a stack structure 14 that is located between the corresponding first signal line SL1 and the corresponding second signal line SL2. Here, the stack structure 14 may be a pillar structure having a cross-section defined by directions I and II that is any of a circular cross-section, an elliptical cross-section, a quadrangular cross-section, a polygonal cross-section, and the like. The stack structure 14 includes a lower electrode 14A, a switching material pattern 14B, an intermediate electrode 14C, a variable resistance pattern 14D, and an upper electrode 14E, which are sequentially stacked on the first signal line SL1 with respect to the orientation of FIG. 2B. In addition, as described above, a capping layer (not illustrated in FIG. 2B) having an impurity removed therefrom may be formed on a sidewall of the stack structure 14, and a densified gap fill layer may surround the stack structure 14.

Referring to an embodiment illustrated by FIG. 2C, the semiconductor memory may include lower and upper sets of second signal lines SL2A and SL2B. The first signal lines SL1 and the lower and upper sets of second signal lines SL2A and SL2B may be arranged in a multi-layered structure. The memory cells MC may be three-dimensionally arranged. For example, the first signal lines SL1, which extend in a first direction I, are located above the lower set of second signal lines SL2A, which extend in a second direction II. The upper set of second signal lines SL2B, which extend in the second direction II, are located above the first signal lines SL1. In this case, the lower set of second signal lines SL2A, the first signal lines SL1, and the upper set of second signal lines SL2B are sequentially stacked in a third direction III crossing the first and second directions I and II.

The memory cells MC may not only be arranged between the first signal lines SL1 and the lower set of second signal lines SL2A but also be arranged between the first signal lines SL1 and the upper set of second signal lines SL2B. Therefore, the memory cells MC may not only be arranged in a matrix form along the first direction I and the second direction II, but also be stacked in the third direction III.

In addition, a capping layer may be disposed on sidewalls of the memory element M and the selection element S of each of the memory cells MC. An impurity may be removed from the capping layer. A densified gap fill layer may fill one or more gaps between the memory cells MC.

According to such a structure, the memory cells MC can be stacked in a vertical direction, e.g., the third direction III, and the memory cells MC in a memory cell array can be three-dimensionally arranged. For reference, the memory cell array may be implemented in a multi-deck structure, wherein another set of first and second signal lines (not illustrated in FIG. 2C) may be additionally stacked on top of the upper set of second signal line SL2B.

Figure 3A:
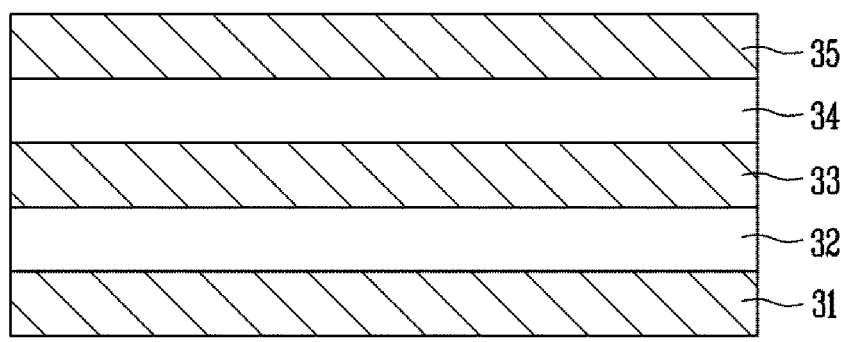
FIGS. 3A to 3C are cross-sectional views illustrating a method for fabricating an electronic device that includes a semiconductor memory according to an embodiment of the present disclosure.
Figure 3B:
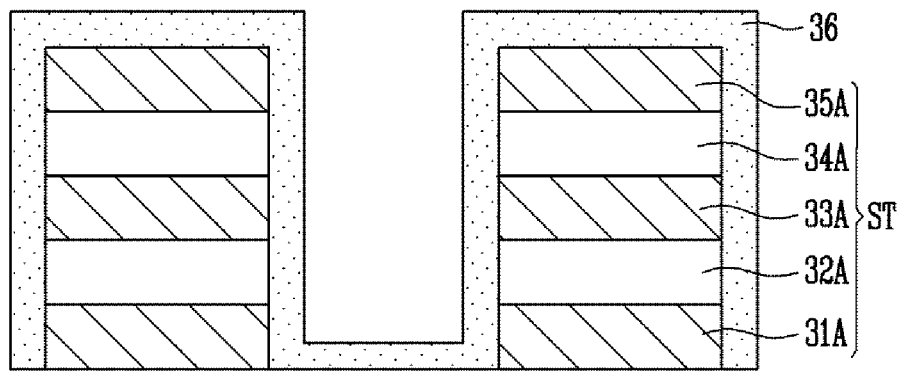
Figure 3C:
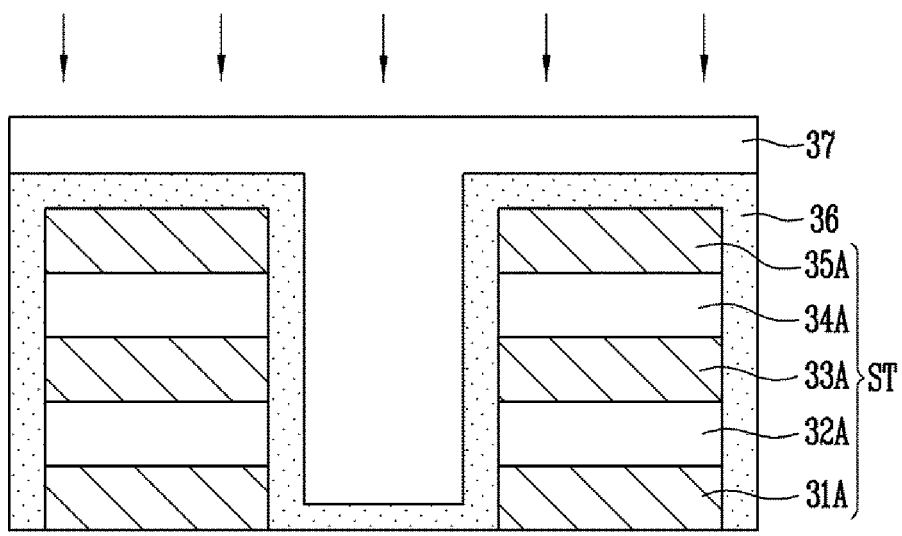

FIGS. 3A to 3C are cross-sectional views illustrating a method for fabricating an electronic device that includes a semiconductor memory according to an embodiment of the present disclosure. Hereinafter, contents that overlap with the descriptions above are omitted.

Referring to FIG. 3A, a lower electrode layer 31, a switching material layer 32, an intermediate electrode layer 33, a variable resistance layer 34, and an upper electrode layer 35 are sequentially formed on a substrate (not shown). Although not illustrated in FIG. 3A, a lower structure including signal lines and the like may also be formed on the substrate. In addition, a hard mask pattern (not shown) may be formed on the upper electrode layer 35. The hard mask pattern may serve as an etching barrier in an etching process that is performed for forming stack structures.

Here, the lower electrode layer 31, the intermediate electrode layer 33, and the upper electrode layer 35, each include a conductive material. The conductive material may include a metal, a metal nitride, carbon, or any combination thereof. The switching material layer 32 may include a chalcogenide-based material, such as $Ge_2Sb_2Te_5$, $As_2Te_3$, Ase, $As_2Se_3$, or a combination thereof. In addition, the variable resistance layer 34 may be any of a phase-change layer, a resistance-change layer, and a magnetic tunnel junction layer.

Referring to FIG. 3B, stack structures ST are formed by patterning the upper electrode layer 35, the variable resistance layer 34, the intermediate electrode layer 33, the switching material layer 32, and the lower electrode layer 31. Each of the stack structures ST includes an upper electrode 35A, a variable resistance pattern 34A, an intermediate electrode 33A, a switching material pattern 32A, and a lower electrode 31A. For example, the stack structures ST are formed by etching the upper electrode layer 35, the variable resistance layer 34, the intermediate electrode layer 33, the switching material layer 32, and the lower electrode layer 31, using the hard mask pattern (not shown) as an etching barrier.

Subsequently, a capping layer 36 is formed on the stack structures ST. The capping layer 36 is formed along surfaces of the stack structures ST. For example, the capping layer 36 may be formed along upper surfaces and sidewalls of the stack structures ST, such that the capping layer 36 surrounds the stack structures ST. The capping layer 36 may also be formed on the bottom of a gap between adjacent stack structures ST. For example, the capping layer 36 may be formed on a portion of an upper surface of the substrate or the lower structure that is exposed by the gap.

The capping layer 36 may include a nitride layer, and may include any of silicon oxide, silicon nitride, and the like. Also, the capping layer 36 may include an impurity, and the impurity may be a hydrogen-based compound. For example, the impurity may be $H_2$, $CH_3$, $NH_3$, $H_2O$, HF, CO, HCL, $CO_2$, or any combination thereof. For example, the capping layer 36 may be a nitride layer including an impurity.

Referring to FIG. 3C, a gap fill layer 37 is formed between the adjacent stack structures ST. The gap fill layer 37 may be formed to fill in a space between the adjacent stack structures ST. The gap fill layer 37 may be formed on the capping layer 36. For example, the gap fill layer 37 may be a flowable oxide layer including spin-on dielectric (SOD), or the like.

Subsequently, the capping layer 36 and the gap fill layer 37 are treated using ultraviolet light, plasma, or both, so that the quality of the capping layer 36 and the gap fill layer 37 can be improved. For example, a heat treatment (annealing) may be performed by irradiating ultraviolet light onto the capping layer 36 and the gap fill layer 37. In an example, the capping layer 36 and the gap fill layer 37 may be exposed to plasma. In various embodiments, a plasma treatment process may be performed while irradiating ultraviolet light onto the capping layer 36 and the gap fill layer 37. For example, the plasma treatment process may be performed after ultraviolet light is irradiated onto the capping layer 36 and the gap fill layer 37, or the ultraviolet light may be irradiated onto the capping layer 36 and the gap fill layer 37 after the plasma treatment process is performed.

The impurity included in the capping layer 36 can be discharged from the capping layer 36 by performing the treatment process using ultraviolet light, plasma, or both. The treatment process may decrease the concentration of the impurity in the capping layer 36 by 50% or more. That is, the concentration of the impurity in the capping layer 36 after the treatment process may be 50% or less of the concentration of the impurity in the capping layer 36 before the treatment process. The capping layer 36 having the impurity removed therefrom may be referred to as a "dehydrogenated capping layer 36." Thus, it is possible to prevent the variable resistance pattern 34A, the switching material pattern 32A, and the like, from being damaged by the impurity in the capping layer 36.

In addition, the treatment process using ultraviolet light and/or plasma can induce cross-linking of the gap fill layer 37, and can densify the gap fill layer 37. Thus, it is possible to form the densified gap fill layer 37, which has substantially no air gaps (or voids) therein. In addition, when an impurity is included in the variable resistance pattern 34A, the impurity included in the variable resistance pattern 34A may also be discharged by the treatment process. For example, a hydrogen-based impurity included in the variable resistance pattern 34A may be discharged.

In addition, a concentration of the impurity in the capping layer 36 and the gap fill layer 37, or a density of the capping layer 36 and the gap fill layer 37, may have a gradient by controlling an ultraviolet light irradiation condition, a plasma treatment condition, etc. For example, the temperature or wavelength of the ultraviolet light may be split when the ultraviolet light irradiation is performed. That is, the ultraviolet light irradiation is performed while changing the temperature or wavelength of the ultraviolet light. For example, the ultraviolet light is irradiated while changing the wavelength of the ultraviolet light from a long wavelength to a short wavelength, changing the wavelength of the ultraviolet light from a short wavelength to a long wavelength, changing the wavelength of the ultraviolet light within a predetermined range, or a combination thereof. In this case, the capping layer 36 may have a gradient structure in which the concentration of the impurity changes along a thickness direction of the capping layer 36. For example, the concentration of the impurity may become higher along a thickness direction toward the stack structure ST, and may become lower along a thickness direction toward the gap fill layer 37.

In addition, the density of the gap fill layer 37 may have a gradient. For example, the density may change along a depth direction, e.g., a stacking direction, of the gap fill layer 37. For example, the density of the gap fill layer 37 may decrease in a downward depth direction toward a lower surface of the gap fill layer 37, and may increase in an upward depth direction toward an upper surface of the gap fill layer 37.

Subsequently, although not shown in these drawings, an additional process for forming signal lines on the stack structures ST may be performed. First, a planarization process, e.g., a chemical mechanical polishing (CMP) process, is performed on the gap fill layer 37 and the capping layer 36 until upper surfaces of the stack structures ST are exposed. Subsequently, upper signal lines extending in one direction are formed on the stack structures ST. In this case, the lower signal lines located on the bottom of the stack structures ST and the upper signal lines located on the top of the stack structures ST extend in different directions, and intersect each other. The stack structures ST may be arranged between the upper and lower signal lines in intersection regions, where the upper and lower signal lines overlap each other in a vertical direction.

According to the process described above, the capping layer 36 and the gap fill layer 37 are treated using ultraviolet light and/or plasma, so that the quality of the capping layer 36 and the gap fill layer 37 can be improved. In addition, in an embodiment, the treatment process using ultraviolet light and/or plasma is performed after both of the capping layer 36 and the gap fill layer 37 are formed, so that the quality of the capping layer 36 and the gap fill layer 37 can be improved at the same time. That is, the gap fill layer 37 can be cured while the impurity of the capping layer 36 is being discharged.

In addition, since ultraviolet light and/or plasma is used, the treatment process can be performed at a relatively low temperature. Thus, even when a material that is sensitive to a high temperature, such as a chalcogenide-based material, is included in the stack structures ST, the fabricating process can be performed within a temperature range that does not affect properties of the variable resistance pattern 34A, the switching material patterns 32A, etc.

FIGS. 4A to 4E are cross-sectional views illustrating a method for fabricating an electronic device that includes a semiconductor memory according to an embodiment of the present disclosure. Hereinafter, contents that overlap with the descriptions above are omitted.

Figure 4A:
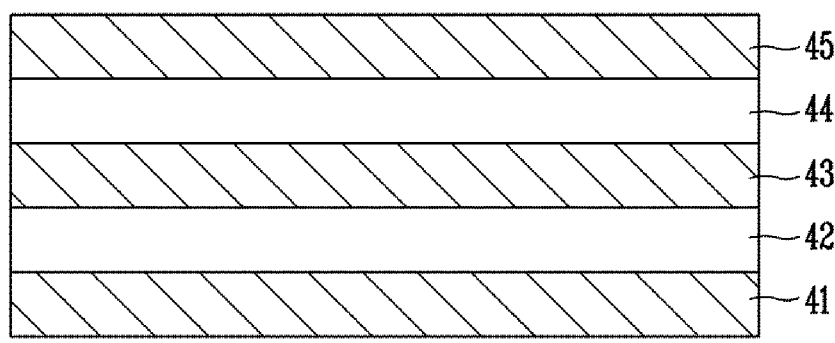
FIGS. 4A to 4E are cross-sectional views illustrating a method for fabricating an electronic device that includes a semiconductor memory according to an embodiment of the present disclosure.

Referring to FIG. 4A, a preliminary stack structure, including a variable resistance layer 44, is formed on a substrate (not shown). A lower structure including signal lines and the like may be formed on the substrate. The preliminary stack structure may include a lower electrode layer 41, a switching material layer 42, an intermediate electrode layer 43, the variable resistance layer 44, and an upper electrode layer 45, which are sequentially stacked on the substrate. Here, the preliminary stack structure may further include a hard mask pattern (not shown), which is formed on the upper electrode layer 45.

Figure 4B:
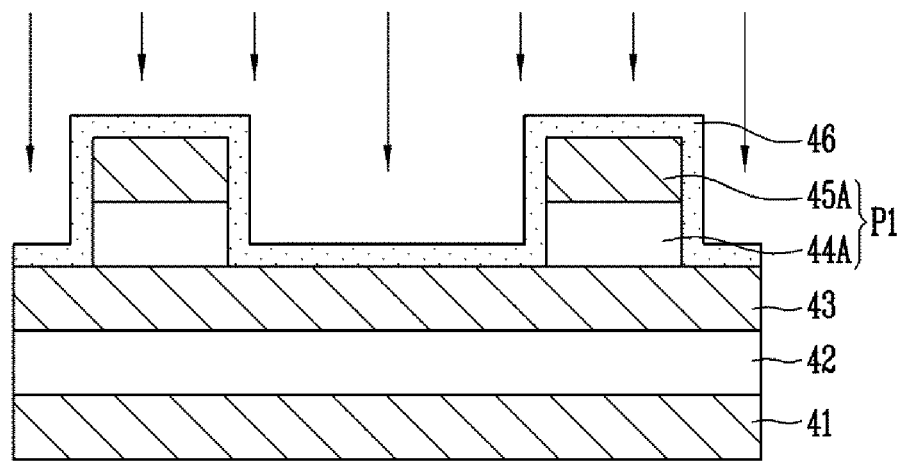

Referring to FIG. 4B, first patterns P1 are formed by partially etching the preliminary stack structure. For example, each of the first patterns P1 includes an upper electrode 45A and a variable resistance pattern 44A, which are formed by etching the upper electrode layer 45 and the variable resistance layer 44, respectively. Subsequently, a first capping layer 46 is formed on the first patterns P1. The first capping layer 46 is formed along surfaces of the first patterns P1. For example, the first capping layer 46 may be formed on upper surfaces and sidewalls of the first patterns P1, and may surround the first patterns P1. The first capping layer 46 may also be formed on a bottom surface of a gap region that is located between adjacent first patterns P1. For example, the first capping layer 46 may cover a portion of an upper surface of the intermediate electrode layer 43.

Subsequently, the first capping layer 46 is irradiated with ultraviolet light and/or the first capping layer 46 is plasma-treated. Accordingly, an impurity in the first capping layer 46 can be discharged. At this time, an impurity included in the variable resistance pattern 44A may also be discharged.

Figure 4C:
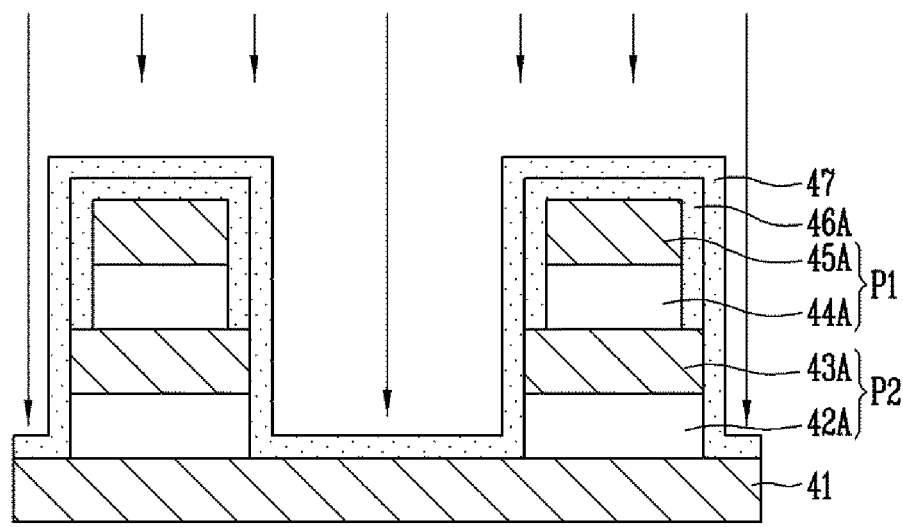

Referring to FIG. 4C, second patterns P2 are formed by partially etching the remaining part of the preliminary stack structure on which the first capping layer 46 is formed. For example, the second patterns P2, which each include an intermediate electrode 43A and a switching material pattern 42A, are formed by etching the intermediate electrode layer 43 and the switching material layer 42, respectively. At this time, the preliminary stack structure may be partially etched by performing a blanket etching process without any separate mask pattern. In this case, portions of the first capping layer 46 that cover the upper surface of the intermediate electrode layer 43 may be etched. As a result, first capping patterns 46A may be formed on the sidewalls, or both the sidewalls and upper surfaces, of the first patterns P1. The second patterns P2 may have a greater width than the first patterns P1.

Subsequently, a second capping layer 47 is formed on the first capping patterns 46A and the second patterns P2. The second capping layer 47 is formed along surfaces of the first capping patterns 46A and the second patterns P2. For example, the second capping layer 47 may be formed on sidewalls of the second patterns P2 and the first capping patterns 46A, and may surround the second patterns P2 and the first capping patterns 46A. The second capping layer 47 may also be formed on a bottom surface of a gap region between adjacent second patterns P2. For example, the second capping layer 47 may cover a portion of an upper surface of the lower electrode layer 41.

Subsequently, the second capping layer 47 is irradiated with ultraviolet light, the second capping layer 47 is plasma-treated, or both. Accordingly, an impurity in the second capping layer 47 can be discharged. In addition, the impurity in the first capping patterns 46A can be further discharged.

Figure 4D:
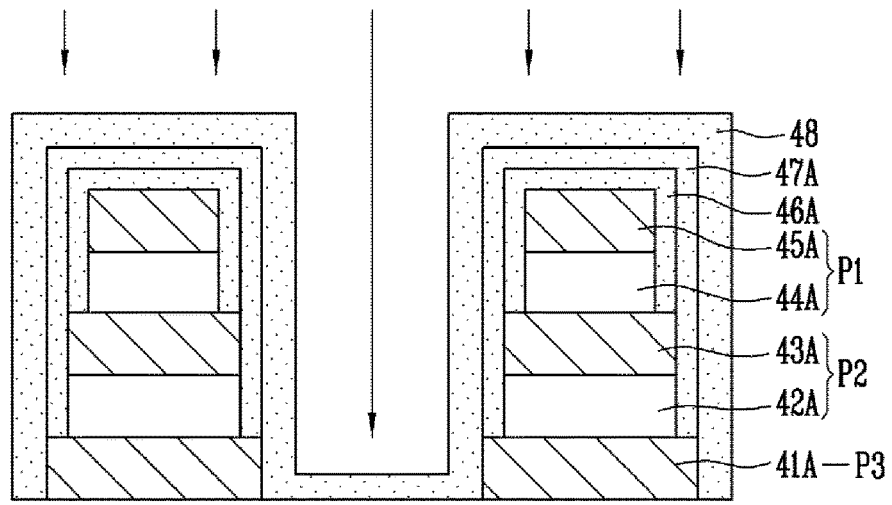

Referring to FIG. 4D, third patterns P3 are formed by partially etching the remaining portion of the preliminary stack structure on which the second capping layer 47 is formed. For example, the third patterns P3, which each include a lower electrode 41A, are formed by etching the lower electrode layer 41. At this time, the preliminary stack structure may be partially etched through a blanket etching process without any separate mask pattern. In this case, a portion of the second capping layer 47 covering the bottom surface of the gap region between the second patterns P2 may be etched. As a result, second capping patterns 47A may be formed on the sidewalls of the second patterns P2 and upper surfaces and sidewalls of the first capping patterns 46A. The third patterns P3 may have a greater width than the second patterns P2. Accordingly, a plurality of stack structures with widths that increase in a downward direction can be formed. Each of the plurality of stack structures includes the first to third patterns P1 to P3.

Subsequently, a third capping layer 48 is formed on the second capping patterns 47A and the third patterns P3. The third capping layer 48 is formed along surfaces of the second capping patterns 47A and the third patterns P3. For example, the third capping layer 48 may be formed on sidewalls of the third patterns P3 as well as upper surfaces and sidewalls of the second capping patterns 47A. The third capping layer 48 may surround the third patterns P3 and the second capping patterns 47A.

The third capping layer 48 may also be formed on a bottom surface of a gap region between adjacent third patterns P3. For example, the third capping layer 48 may cover a portion of a substrate or lower structure, which is exposed by the gap region.

Subsequently, the third capping layer 48 is irradiated with ultraviolet light, the third capping layer 48 is plasma-treated, or both. Accordingly, an impurity in the third capping layer 48 can be discharged. In addition, the impurity can be further discharged from the first and second capping patterns 46A and 47A.

Figure 4E:
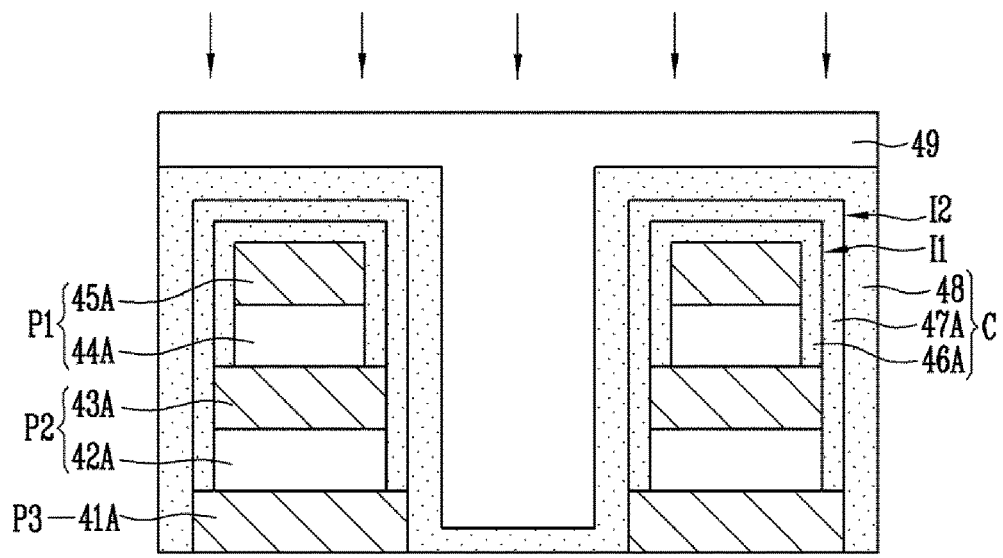

Accordingly, capping structures C having multi-layered structures are formed, as shown in FIG. 4E. Each of the capping structures C includes one or more interfaces that have been treated with ultraviolet light, plasma, or both. For example, each of the capping structures C may include a first interface I1, which is between one of the first capping patterns 46A and one of the second capping patterns 47A, and a second interface I2, which is between one of the second capping patterns 47A and the third capping layer 48. One or both of the first and second interfaces I1 and I2 of each of the capping structures C may have been treated with ultraviolet light, plasma, or both.

Also, in the process of forming the capping structures C, multiple treatment processes using ultraviolet light, plasma, or both, are performed. Thus, a larger amount of the impurity may be discharged from the capping layers 46A, 47A, and 48, than a process that only includes one treatment process using ultraviolet light and/or plasma.

In particular, a capping layer that is formed earlier in the manufacturing process is more likely to be substantially free of the impurity than a capping layer formed at a later stage in the manufacturing process. For example, the concentration of the impurity in the first capping patterns 46A may be lower than the concentration of the impurity in the second capping patterns 47A, and the concentration of the impurity in the second capping pattern 47A may be lower than the concentration of the impurity in the third capping layer 48. Therefore, each of the capping structures C has an impurity concentration gradient. For example, the impurity concentration in each of the capping structures C changes along a thickness direction, as well as a stacking direction, of the stack structure that includes the first to third patterns P1 to P3.

Subsequently, a gap fill layer 49 is formed between adjacent stack structures. The gap fill layer 49 may fill a space between the adjacent stack structures. The gap fill layer 49 may be formed on the third capping layer 48. For example, the gap fill layer 49 may be a flowable oxide layer.

Subsequently, the capping structures C and the gap fill layer 49 are irradiated with ultraviolet light, the capping structures C and the gap fill layer 49 are plasma-treated, or both. In various embodiments, the capping structures C and the gap fill layer 49 are plasma treated while being irradiated with ultraviolet light, or the ultraviolet light irradiation process and the plasma treatment process may be sequentially performed. Accordingly, the gap fill layer 49 can be densified while the impurity is discharged from the capping structures C.

Although a case where a surface treatment is performed on each of the capping layers 46, 47, and 48 using ultraviolet light, plasma, or both is described in reference to the embodiment illustrated in FIGS. 4A to 4E, the surface treatment may be performed on some of the capping layers 46, 47, and 48 without being performed on one or more of the capping layers 46, 47, and 48. For example, a surface treatment may not be performed on the third capping layer 48 until the gap fill layer 49 is formed, such that the third capping layer 48 and the gap fill layer can be exposed to ultraviolet light, plasma treatment, or both, simultaneously.

According to the fabricating method described above, the capping structures C, each having the multi-layered structure, can be formed. In addition, each of the capping structures C includes one or more interfaces that are treated using ultraviolet light, plasma, or both. Thus, the impurity in each of the capping structures C can be easily discharged, and the quality of the layers in each of the capping structures C can be improved.

Figure 5:
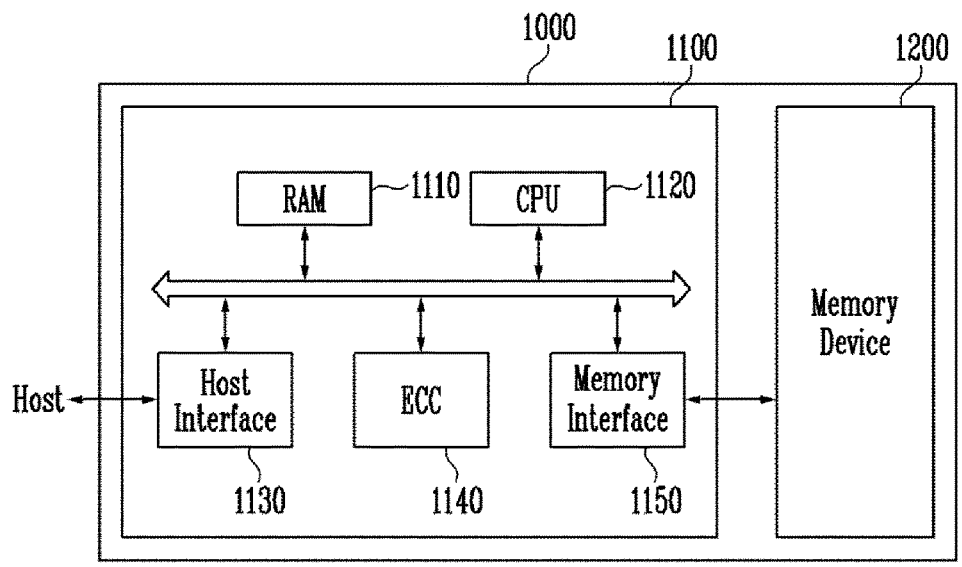
FIGS. 5 and 6 are block diagrams illustrating configurations of memory systems according to embodiments of the present disclosure.

FIG. 5 is a block diagram illustrating a configuration of a memory system according to an embodiment of the present disclosure.

Referring to FIG. 5, the memory system 1000 according to the embodiment of the present disclosure includes a memory device 1200 and a controller 1100.

The memory device 1200 is used to store data information having various data formats such as texts, graphics, and software codes. The memory device 1200 may be a nonvolatile memory. Also, the memory device 1200 may have the structures described with reference to FIGS. 1A to 4E, and be manufactured according to the fabricating methods described with reference to FIGS. 1A to 4E. In an embodiment, the memory device 1200 may include: stack structures; first capping layers covering first portions of sidewalls of the stack structures; second capping layers covering the first capping layer and second portions of the sidewalls of the stack structures, the second portions being exposed by the first capping layers; and a gap fill layer filling one or more gaps between the stack structures, wherein a concentration of a hydrogen-based impurity in the first capping layers is lower than a concentration of the hydrogen-based impurity in the second capping layers. The structure and manufacturing method of the memory device 1200 are the same as described above, and therefore, their detailed descriptions will be omitted.

The controller 1100 is connected to a host and the memory device 1200, and is configured to access the memory device 1200 in response to a request from the host. For example, the controller 1100 is configured to control reading, writing, erasing, and background operations of the memory device 1200.

The controller 1100 includes a random access memory (RAM) 1110, a central processing unit (CPU) 1120, a host interface 1130, an error correction code (ECC) circuit 1140, a memory interface 1150, and the like.

Here, the RAM 1110 may be used as an operation memory of the CPU 1120, a cache memory between the memory device 1200 and the host, and a buffer memory between the memory device 1200 and the host. For reference, the RAM 1110 may be replaced with a static random access memory (SRAM), a read only memory (ROM), etc.

The CPU 1120 is configured to control overall operations of the controller 1100. For example, the CPU 1120 is configured to operate firmware such as a flash translation layer (FTL) stored in the RAM 1110.

The host interface 1130 is configured to interface with the host. For example, the controller 1100 communicates with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The ECC circuit 1140 is configured to detect and correct an error included in data that is read from the memory device 1200, using an error correction code (ECC).

The memory interface 1150 may be configured to interface with the memory device 1200. For example, the memory interface 1150 includes an NAND interface or NOR interface.

For reference, the controller 1100 may further include a buffer memory (not shown) for temporarily storing data. Here, the buffer memory may be used to temporarily store data transferred to the outside through the host interface 1130 or data transferred from the memory device 1200 through the memory interface 1150. The controller 1100 may further include a ROM that stores code data for interfacing with the host.

As described above, the memory system 1000 according to the embodiment of the present disclosure includes the memory device 1200 having an improved degree of integration and improved characteristics, and thus it is possible to improve the degree of integration and characteristics of the memory system 1000.

Figure 6:
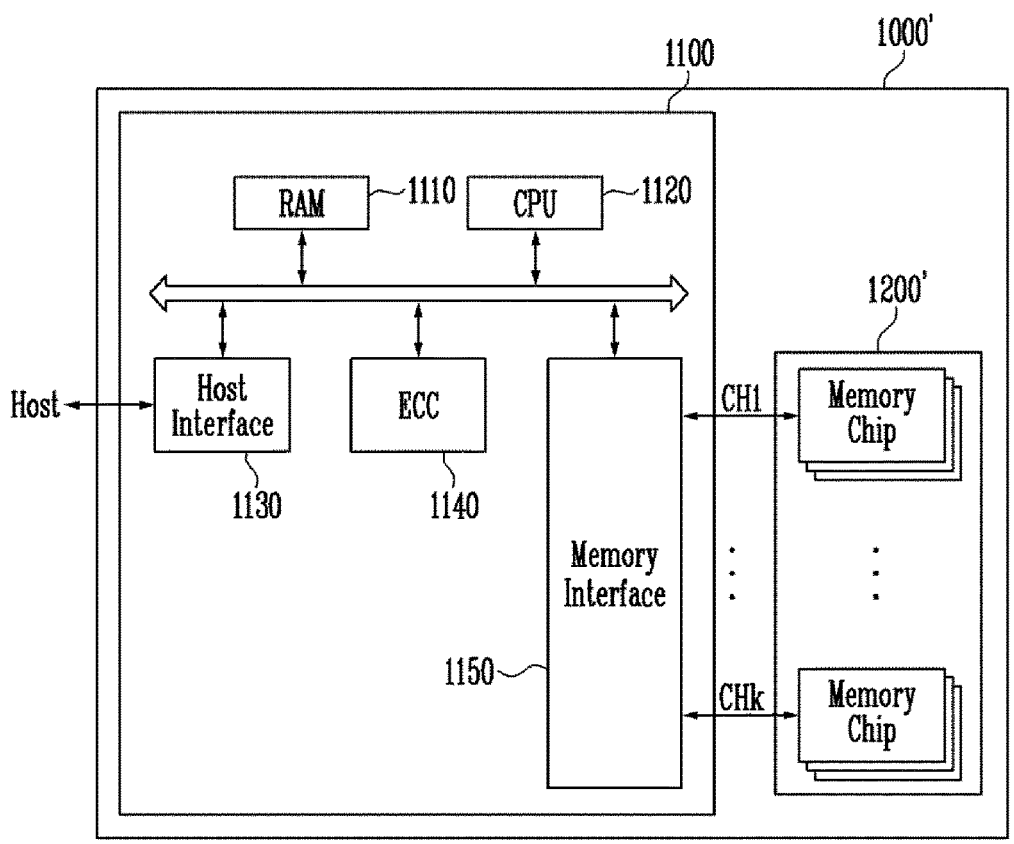

FIG. 6 is a block diagram illustrating a configuration of a memory system according to an embodiment of the present disclosure. Hereinafter, descriptions of contents that overlap with the descriptions above are omitted.

Referring to FIG. 6, the memory system 1000' according to the embodiment of the present disclosure includes a memory device 1200' and a controller 1100. The controller 1100 includes a RAM 1110, a CPU 1120, a host interface 1130, an ECC circuit 1140, a memory interface 1150, and the like.

The memory device 1200' may be a nonvolatile memory. Also, the memory device 1200' may have the structures described with reference to FIGS. 1A to 4E, and be manufactured according to the fabricating methods described with reference to FIGS. 1A to 4E. In an embodiment, the memory device 1200' may include: stack structures; first capping layers covering first portions of sidewalls of the stack structures; second capping layers covering the first capping layer and second portions of the sidewalls of the stack structures, the second portions being exposed by the first capping layers; and a gap fill layer filling one or more gaps between the stack structures, wherein a concentration of a hydrogen-based impurity in the first capping layers is lower than a concentration of the hydrogen-based impurity in the second capping layers. The structure and manufacturing method of the memory device 1200' are the same as described above, and therefore, their detailed descriptions will be omitted.

The memory device 1200' may be a multi-chip package including a plurality of memory chips. The plurality of memory chips are divided into a plurality of groups, which are configured to communicate with the controller 1100 over first to kth channels (CH1 to CHk). In addition, memory chips included in one group may be configured to communicate with the controller 1100 over a common channel. For reference, the memory system 1000' may be modified such that one memory chip is connected to one channel.

As described above, the memory system 1000' according to the embodiment of the present disclosure includes the memory device 1200' having an improved degree of integration and improved characteristics, and thus it is possible to improve the degree of integration and characteristics of the memory system 1000'. Particularly, the memory device 1200' is configured as a multi-chip package, so that it is possible to increase the data storage capacity of the memory system 1000' and to improve the operation speed of the memory system 1000'.

Figure 7:
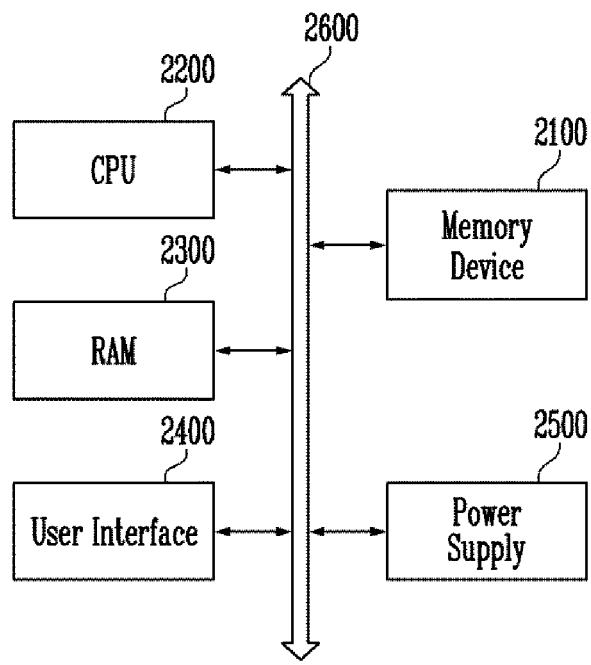
FIGS. 7 and 8 are block diagrams illustrating configurations of computing systems according to embodiments of the present disclosure.

FIG. 7 is a block diagram illustrating a configuration of a computing system according to an embodiment of the present disclosure. Hereinafter, descriptions of contents that overlap with the descriptions above are omitted.

Referring to FIG. 7, the computing system 2000 according to the embodiment of the present disclosure includes a memory device 2100, a CPU 2200, a RAM 2300, a user interface 2400, a power source 2500, a system bus 2600, and the like.

The memory device 2100 stores data provided through the user interface 2400, data processed by the CPU 2200, and the like. In addition, the memory device 2100 is electrically connected to the CPU 2200, the RAM 2300, the user interface 2400, the power source 2500, and the like through the system bus 2600. For example, the memory device 2100 may be connected to the system bus 2600 through a controller (not shown) or directly. When the memory device 2100 is directly connected to the system bus 2600, a function of the controller may be performed by the CPU 2200, the RAM 2300, etc.

Here, the memory device 2100 may be a nonvolatile memory. Also, the memory device 2100 may have the structures described with reference to FIGS. 1A to 4E, and be manufactured according to the fabricating methods described with reference to FIGS. 1A to 4E. In an embodiment, the memory device 2100 may include: stack structures; first capping layers covering first portions of sidewalls of the stack structures; second capping layers covering the first capping layer and second portions of the sidewalls of the stack structures, the second portions being exposed by the first capping layers; and a gap fill layer filling one or more gaps between the stack structures, wherein a concentration of a hydrogen-based impurity in the first capping layers is lower than a concentration of the hydrogen-based impurity in the second capping layers. The structure and manufacturing method of the memory device 2100 are the same as described above, and therefore, their detailed descriptions will be omitted.

The memory device 2100 may be a multi-chip package including a plurality of memory chips as described with reference to FIG. 8.

The computing system 2000 configured as described above may be a computer, a ultra mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for communicating information in a wireless environment, one of a variety of electronic devices constituting a home network, one of a variety of electronic devices constituting a computer network, one of a variety of electronic devices constituting a telematics network, an RFID device, etc.

As described above, the computing system 2000 according to the embodiment of the present disclosure includes the memory device 2100 having an improved degree of integration and improved characteristics, and thus it is possible to improve the degree of integration and characteristics of the computing system 2000.

Figure 8:
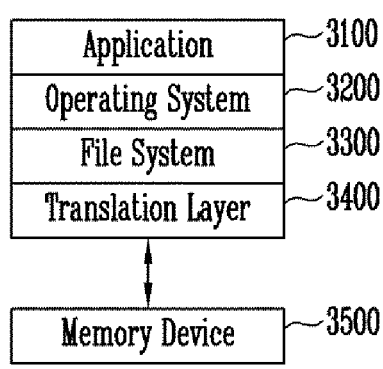

FIG. 8 is a block diagram illustrating a computing system according to an embodiment of the present disclosure.

Referring to FIG. 8, the computing system 3000 according to the embodiment of the present disclosure includes a software layer including an operating system 3200, an application 3100, a file system 3300, a translation layer 3400, and the like. In addition, the computing system 3000 includes a hardware layer of a memory device 3500, etc.

The operating system 3200 may manage software resources, hardware resources, etc. of the computing system 3000, and control program execution of a central processing unit. The application 3100 is one of a variety of application programs running on the computing system 3000, and may be a utility executed by the operating system 3200.

The file system 3300 means a logical structure for managing data, files, etc. in the computing system 3000, and organizes the data or files stored in the memory device 3500 according to a rule. The file system 3300 may be determined depending on the operating system 3200 used in the computing system 3000. For example, when the operating system 3200 is one of Windows operating systems of Microsoft, the file system 3300 may be a file allocation table (FAT) or a NT file system (NTFS). When the operating system 3200 is one of Unix/Linux operating systems, the file system 3300 may be an extended file system (EXT), a Unix file system (UFS), or a journaling file system (JFS).

In this drawing, the operating system 3200, the application 3100, and the file system 3300 are shown as individual blocks. However, the application 3100 and the file system 3300 may be included in the operating system 3200.

The translation layer 3400 translates an address into a form suitable for the memory device 3500 in response to a request from the file system 3300. For example, the translation layer 3400 translates a logical address generated by the file system 3300 into a physical address of the memory device 3500. Here, mapping information between the logical address and the physical address may be stored as an address translation table. For example, the translation layer 3400 may be a flash translation layer (FTL), a universal flash storage link layer (ULL), etc.

The memory device 3500 may be a nonvolatile memory. Also, the memory device 3500 may have the structures described with reference to FIGS. 1A to 4E, and be manufactured according to the fabricating methods described with reference to FIGS. 1A to 4E. In an embodiment, the memory device 3500 may include: stack structures; first capping layers covering first portions of sidewalls of the stack structures; second capping layers covering the first capping layer and second portions of the sidewalls of the stack structures, the second portions being exposed by the first capping layers; and a gap fill layer filling one or more gaps between the stack structures, wherein a concentration of a hydrogen-based impurity in the first capping layers is lower than a concentration of the hydrogen-based impurity in the second capping layers. The structure and manufacturing method of the memory device 3500 are the same as described above, and therefore, their detailed descriptions will be omitted.

The computing system 3000 configured as described above may be divided into an operating system layer performed in an upper level region and a controller layer performed in a lower level region. Here, the application 3100, the operating system 3200, and the file system 3300 are included in the operating system layer, and may be driven by the operation memory of the computing system 3000. In addition, the translation layer 3400 may be included in the operating system layer or the controller layer.

As described above, the computing system 3000 according to the embodiment of the present disclosure includes the memory device 3500 having an improved degree of integration and improved characteristics, and thus it is possible to improve the degree of integration and characteristics of the computing system 3000.

In the electronic device and the method for fabricating the same according to the present disclosure, the operational characteristics and reliability of memory cells can be improved. In particular, it is possible to prevent characteristic degradation of a variable resistance material.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method for fabricating an electronic device that includes a semiconductor memory, the method comprising:
    forming stack structures, each of the stack structures including a variable resistance pattern;
    forming capping layers on the stack structures, the capping layers including a hydrogen-based compound as an impurity;
    forming a gap fill layer between the stack structures; and
    removing the impurity from the capping layers and densifying the gap fill layer by irradiating the capping layers and the gap fill layer with ultraviolet light.

2. The method of claim 1, wherein forming the stack structures includes:
    forming a preliminary stack structure, the preliminary stack structure including a variable resistance layer;
    forming a first pattern by partially etching the preliminary stack structure;
    forming a first capping layer on the first pattern;
    forming a second pattern underneath the first pattern by partially etching the preliminary stack structure; and
    forming a second capping layer on the second pattern and the first capping layer.

3. The method of claim 2, further comprising, after the first capping layer is formed, irradiating the first capping layer with ultraviolet light.

4. The method of claim 2, further comprising, after the second capping layer is formed, irradiating the second capping layer with ultraviolet light.

5. The method of claim 2, further comprising:
    forming a third pattern underneath the second pattern by partially etching the preliminary stack structure; and
    forming a third capping layer on the third pattern and the second capping layer.

6. The method of claim 5, further comprising, after the third capping layer is formed, irradiating the third capping layer with ultraviolet light.

7. The method of claim 1, wherein forming the stack structures and forming the capping layers on the stack structures include:
    sequentially forming a switching material layer, an intermediate electrode layer, a variable resistance layer, and an upper electrode layer on a lower electrode layer;
    forming an upper electrode and the variable resistance pattern by respectively etching the upper electrode layer and the variable resistance layer;
    forming a first capping layer on the upper electrode and the variable resistance pattern;
    forming an intermediate electrode and a switching material pattern by respectively etching the intermediate electrode layer and the switching material layer;
    forming a second capping layer on the intermediate electrode, the switching material pattern, and the first capping layer;
    forming a lower electrode by etching the lower electrode layer; and
    forming a third capping layer on the lower electrode and the second capping layer.

8. The method of claim 7, further comprising: after the first capping layer is formed, irradiating the first capping layer with ultraviolet light.

9. The method of claim 7, further comprising: after the second capping layer is formed, irradiating the second capping layer with ultraviolet light.

10. The method of claim 7, further comprising: after the third capping layer is formed, irradiating the third capping layer with ultraviolet light.

11. The method of claim 1, wherein the capping layers include a nitride material.

12. The method of claim 1, wherein the impurity includes $H_2$, $CH_3$, $NH_3$, $H_2O$, HF, CO, HCL, $CO_2$, or a combination thereof.

13. The method of claim 1, wherein irradiating the capping layers and the gap fill layer with the ultraviolet light is performed by changing a temperature or a wavelength of the ultraviolet light, and
    wherein after the capping layers and the gap fill layer are irradiated with the ultraviolet light, the remaining impurity in the capping layers has a gradient, a concentration of the impurity in each of the capping layers changing in a thickness direction of the capping layers.

14. The method of claim 1, wherein irradiating the capping layers and the gap fill layer with the ultraviolet light is performed by changing a temperature or a wavelength of the ultraviolet light, and
    wherein after the capping layers and the gap fill layer are irradiated with the ultraviolet light, a density of the gap fill layer has a gradient, the density of the gap fill layer changing along a depth direction of the gap fill layer, the depth direction corresponding to a stacking direction of the stack structure.

15. The method of claim 1, wherein the capping layers and the gap fill layer are exposed to plasma when the capping layers and the gap fill layer are irradiated with the ultraviolet light.

16. The method of claim 1, further comprising: before or after the capping layers and the gap fill layer are irradiated with the ultraviolet light, exposing the capping layers and the gap fill layer to plasma.

17. The method of claim 1, wherein the variable resistance pattern includes a phase-change material.

18. The method of claim 1, wherein the variable resistance pattern includes the hydrogen-based compound as the impurity and the impurity of the variable resistance pattern is removed when the impurity of the capping layers is removed.

19. A method for fabricating an electronic device that includes a semiconductor memory, the method comprising:
    forming stack structures, each of the stack structures including a variable resistance pattern;
    forming capping layers on the stack structures, the capping layers including a hydrogen-based compound as an impurity;
    forming a gap fill layer between the stack structures; and
    removing the impurity from the capping layers and densifying the gap fill layer by plasma-treating the capping layers and the gap fill layer.

20. A method for fabricating an electronic device that includes a semiconductor memory, the method comprising:
    forming stack structures, each of the stack structures including a first electrode, a variable resistance pattern on the first electrode, and a second electrode on the variable resistance pattern;
    forming capping layers on sidewalls of the stack structures, the capping layers including a hydrogen-based compound as an impurity;
    forming a gap fill layer between the stack structures; and
    irradiating the capping layers and the gap fill layer with ultraviolet light to dehydrogenate the capping layers and to densify the gap fill layer.

* * * * *